United States Patent
Jeon et al.

(10) Patent No.: US 7,084,682 B2
(45) Date of Patent: Aug. 1, 2006

(54) DELAY-LOCKED LOOP CIRCUIT AND METHOD THEREOF FOR GENERATING A CLOCK SIGNAL

(75) Inventors: Phil-Jae Jeon, Osan-si (KR); Doh-Young Kim, Seoul (KR)

(73) Assignee: Samsung Electronics, Co., Ltd. (KR)

( * ) Notice: Subject to any disclaimer, the term of this patent is extended or adjusted under 35 U.S.C. 154(b) by 40 days.

(21) Appl. No.: 10/965,450

(22) Filed: Oct. 14, 2004

(65) Prior Publication Data
US 2005/0093598 A1 May 5, 2005

(30) Foreign Application Priority Data
Oct. 31, 2003 (KR) ............... 10-2003-0076990

(51) Int. Cl.
*H03L 7/06* (2006.01)
(52) U.S. Cl. .................. 327/158; 327/149; 327/159; 327/161
(58) Field of Classification Search ............... None
See application file for complete search history.

(56) References Cited

U.S. PATENT DOCUMENTS

| | | | |
|---|---|---|---|
| 5,642,082 A * | 6/1997 | Jefferson | 331/25 |
| 5,994,934 A * | 11/1999 | Yoshimura et al. | 327/158 |
| 6,326,826 B1 | 12/2001 | Lee et al. | 327/161 |
| 6,667,643 B1 * | 12/2003 | Ko | 327/158 |
| 6,844,761 B1 * | 1/2005 | Byun et al. | 327/149 |
| 2003/0053577 A1 | 3/2003 | Wataral | 375/375 |

FOREIGN PATENT DOCUMENTS

| | | |
|---|---|---|
| EP | 1294101 A3 | 8/2004 |
| JP | 03-87114 | 3/2003 |
| KR | 03-27866 | 4/2003 |

* cited by examiner

*Primary Examiner*—Tuan T. Lam
*Assistant Examiner*—William Hernandez
(74) *Attorney, Agent, or Firm*—Mills & Onello LLP

(57) ABSTRACT

A delay-locked loop circuit includes a phase frequency detector, a charge pump, a loop filter, a voltage controlled delay line and a coarse lock detector. The phase frequency detector generates an up signal and a down signal corresponding to phase and frequency differences between an input clock signal and a feedback signal. The charge pump receives the up signal, the down signal and a coarse lock detection signal to generate a current signal. The loop filter receives and filters the current signal through a low-pass filter to generate a direct voltage signal. The voltage controlled delay line receives the input clock signal and the direct voltage signal to generate the feedback signal and control signals. The coarse lock detector receives the control signals to generate the initialization signal and the coarse lock detection signal to adjust Td within Tin/2<Td<2×Tin when Td≧2×Tin or Td≦Tin/2.

21 Claims, 13 Drawing Sheets

$Tin/2 < Td < 2 \times Tin$ $Td \geq 2 \times Tin$

< Tin/2 < Td < 2 × Tin >

DELAY-LOCKED LOOP CIRCUIT AND METHOD THEREOF FOR GENERATING A CLOCK SIGNAL

CROSS REFERENCE TO RELATED APPLICATION

This application claims priority under 35 USC § 119 to Korean Patent Application No. 2003-76990, filed on Oct. 31, 2003, the contents of which are herein incorporated by reference in their entirety for all purposes.

BACKGROUND OF THE INVENTION

1. Field of the Invention

The present invention relates to a delay-locked loop (DLL) circuit, and more particularly to a delay-locked loop (DLL) circuit capable of achieving a stable lock state over a wide range of delay time.

2. Description of the Related Art

A delay-locked loop (DLL) circuit is a circuit that can output a periodic signal with the same period as an input clock signal, and with a delay equal to the period of the input clock signal.

FIG. 1 is a block diagram illustrating a conventional delay-locked loop circuit.

Referring to FIG. 1, the delay-locked loop circuit includes a phase frequency detector (hereinafter, referred to as PFD) 10, a charge pump circuit 20, a loop filter 30 and a voltage controlled delay line (hereinafter, referred to as VCDL) 40. The PFD 10 receives an input clock signal FIN and a feedback signal FFEED, and detects phase difference between the two signals to generate an up signal UP and a down signal DOWN. The charge pump 20 receives the up signal UP and the down signal DOWN to generate a current signal that varies with logic states of the up signal UP and the down signal DOWN. The loop filter 30 receives the current signal from the charge pump circuit 20 and filters the current signal through the low-pass filtering to generate a dc voltage signal VFILT. The VCDL 40 receives the input clock signal FIN and the dc voltage signal VFILT and delays the input clock signal FIN by predetermined time in response to the dc voltage signal VFILT. The delayed signal from the VCDL becomes an output signal DLLO and the feedback signal FFEED.

FIGS. 2A through 2D are timing diagrams illustrating locked states according to conditions of delay times in the conventional delay-locked loop circuit shown in FIG. 1. FIG. 2A represents a locked state when $Tin/2 < Td < 2 \times Tin$. FIG. 2B shows a locked state when $Td \geq 2 \times Tin$ and FIG. 2C shows a locked state when $Td \leq Tin/2$, both indicating a harmonic lock. In FIG. 2D, the PFD is used instead of a phase detector (hereinafter, referred to as PD). When an initial state of the PFD is distorted, the PFD can output the up signal UP notwithstanding that the down signal DOWN has to be outputted, so that the VCDL may output a distorted output signal, not a restored signal. The lock state as in FIG. 2D is referred to as a dead lock. The harmonic lock and the dead lock should be prevented in order to implement a DLL having a wide lock range.

SUMMARY OF THE INVENTION

Accordingly, the present invention is provided to substantially obviate one or more problems due to limitations and disadvantages of the related art.

It is a feature of the present invention to provide a delay-locked loop (DLL) circuit capable of achieving a stable lock state over a wide range of delay time.

In accordance with one aspect of the present invention, there is provided a delay-locked loop circuit. The delay-locked loop circuit includes a phase frequency detector, a charge pump, a loop filter, a voltage controlled delay line and a coarse lock detector. The phase frequency detector receives an input clock signal, a feedback signal and an initialization signal, and generates an up signal and a down signal according to a phase difference and a frequency difference between the input clock signal and the feedback signal, upon control of the initialization signal. The charge pump receives the up signal, the down signal and a coarse lock detection signal, and generates a current signal that varies with states of the up signal, the down signal and the coarse lock detection signal. The loop filter receives the current signal from the charge pump circuit, and filters the current signal through a low-pass filter to generate a dc voltage signal. The voltage controlled delay line receives the input clock signal and the dc voltage signal, and generates the feedback signal and control signals in response to the dc voltage signal, the feedback signal being obtained by delaying the input clock signal by a predetermined period, and the control signals having different phase from each other. The coarse lock detector receives the control signals from the voltage controlled delay line and generates the initialization signal and the coarse lock detection signal to control the phase frequency detector and the charge pump circuit so that Td may be adjusted within a range of $Tin/2 < Td < 2 \times Tin$ when Td is smaller than $Tin/2$ or greater than twice Tin, wherein Tin represents a period of the input clock signal and Td represents a delay time thereof.

In one embodiment, the voltage controlled delay line includes: a delay section configured to have first through N-th delay elements which are cascade-connected to delay the input clock signal by a predetermined period in response to the dc voltage signal; and a control signal generator configured to generate first through fifth control signals using a portion of input signals and output signals of the N delay elements.

In one embodiment, the control signal generator includes: a first control signal generating circuit configured to generate the first control signal based on the input signal and the output signal of the first delay element; a second control signal generating circuit configured to generate the second control signal based on the input signal and the output signal of the second delay element; a third control signal generating circuit configured to generate the third control signal based on the input signal and the output signal of the third delay element; a fourth control signal generating circuit configured to generate the fourth control signal based on the input signal and the output signal of the fourth delay element; and a fifth control signal generating circuit configured to generate the fifth control signal based on the input signal and the output signal of the N-th delay element.

In one embodiment, N is 7.

In one embodiment, the first control signal generating circuit includes: an inverter configured to invert an output signal of the first delay element; and a NAND gate configured to receive the input signal of the first delay element and an output signal of the inverter to perform a logical NAND operation.

In one embodiment, the second control signal generating circuit includes: an inverter configured to invert an output signal of the second delay element; and a NAND gate configured to receive the input signal of the second delay element and an output signal of the inverter to perform a logical NAND operation.

In one embodiment, the third control signal generating circuit includes: an inverter configured to invert an output signal of the third delay element; and a NAND gate configured to receive the input signal of the third delay element and an output signal of the inverter to perform a logical NAND operation.

In one embodiment, the fourth control signal generating circuit includes: an inverter configured to invert an output signal of the fourth delay element; and a NAND gate configured to receive the input signal of the fourth delay element and an output signal of the inverter to perform a logical NAND operation.

In one embodiment, the fifth control signal generating circuit includes: an inverter configured to invert an output signal of the Nth delay element; and a NAND gate configured to receive the input signal of the Nth delay element and an output signal of the inverter to perform a logical NAND operation.

In one embodiment, each of the delay elements includes: a first PMOS transistor configured to have its source coupled to a first power source voltage, and its gate having a bias voltage applied; a second PMOS transistor configured to have its source coupled to a drain of the first PMOS transistor, and its gate having an input signal applied; a first NMOS transistor configured to have its drain coupled to a drain of the second PMOS transistor to provide a output signal, and its gate having the input signal applied; and a second NMOS transistor configured to have its drain coupled to a source of the first NMOS transistor, and its gate having the direct voltage signal applied, and its source being coupled to a second power voltage.

In one embodiment, the coarse lock detector includes: a first latch circuit configured to have an input terminal, a reset terminal to which the first control signal is applied, a clock terminal to which the second control signal is applied, and an output terminal, to latch the first control signal in response to the second control signal; a second latch circuit configured to have an input terminal, a reset terminal to which the first control signal is applied, a clock terminal to which the third control signal is applied, and an output terminal, to latch the first control signal in response to the third control signal; a first AND gate configured to receive an output signal of the first latch signal and an output signal of the second latch circuit to perform a logical AND operation; a flip-flop circuit configured to have an input terminal to which an output signal of the first control signal is applied, a clock terminal to which the fifth control signal is applied, and an output terminal, to output the coarse lock detection signal in response to the fifth control signal; and a second AND gate configured to receive the coarse lock detection signal and the fourth control signal to perform a logical AND operation and configured to output the initialization signal.

In one embodiment, the first latch circuit latches the first control signal at a leading edge of the second control signal, and the second latch circuit latches the first control signal at a leading edge of the third control signal.

In one embodiment, the flip-flop circuit outputs the coarse lock detection signal at a leading edge of the fifth control signal.

In one embodiment, the phase frequency detector includes: a first flip-flop circuit configured to have an input terminal to which a signal having a first state is applied, a clock terminal to which the clock signal is applied, a reset terminal to which a reset signal is applied, and an output terminal for outputting the up signal; a second flip-flop circuit configured to have an input terminal to which the signal having the first state is applied, a clock terminal to which the feedback signal is applied, a reset terminal to which the reset signal is applied, and an output terminal for outputting the down signal; a NAND gate configured to receive the up signal and the down signal to perform a logical NAND operation; and an AND gate configured to receive an output signal of the NAND gate and the initialization signal to perform a logical AND operation and configured to output the reset signal.

In one embodiment, the charge pump circuit includes: an inverter configured to invert the up signal; a first PMOS transistor configured to have its source coupled to a first power source voltage, its gate coupled to an output terminal of the inverter and its drain coupled to the dc voltage signal; an NMOS transistor configured to have its drain coupled to the dc voltage signal, its gate having the down signal applied, and its source coupled to a second power source voltage; and a second PMOS transistor configured to have its source coupled to the first power source voltage, its gate having the coarse lock detection signal applied, and its drain coupled to the dc voltage signal.

In one embodiment, the loop filter includes a capacitor coupled between the drain of the first PMOS transistor and the second power source voltage.

In accordance with another aspect of the present invention, there is provided a method of generating a clock signal. In the method of generating a clock signal, an input clock signal, a feedback signal and an initialization signal are received to generate an up signal and a down signal according to a phase difference and a frequency difference between the input clock signal and the feedback signal, upon control of the initialization signal. The up signal, the down signal and a coarse lock detection signal are received to generate a current signal that varies with states of the up signal, the down signal and the coarse lock detection signal. The current signal is received and filtered through a low-pass filter to generate a dc voltage signal. The input clock signal and the dc voltage signal are received to generate the feedback signal and first through fifth control signals in response to the dc voltage signal, the feedback signal being obtained by delaying the input clock signal by a predetermined period and the control signals having different phase from each other. The first through fifth control signals are received to generate the initialization signal and the coarse lock detection signal to adjust Td within Tin/2<Td<2×Tin when Td is smaller than Tin/2 or greater than twice Tin, Tin representing a clock period of the input clock signal and the Td representing a delay time thereof.

In one embodiment, the step of generating the initialization signal and the coarse lock detection signal includes: latching the first control signal in response to the second control signal to output a first signal; latching the first control signal in response to the third control signal to output a second signal; receiving the first and second signals to perform a logical AND operation, thereby outputting a third signal; receiving the third signal to output the coarse lock detection signal in response to the fifth control signal; and receiving the coarse lock detection signal and the fourth control signal to perform the logical AND operation, thereby generating the initialization signal.

In one embodiment, the step of latching the first control signal in response to the second control signal includes latching the first control signal at a leading edge of the second control signal, and the step of latching the first control signal in response to the third control signal includes latching the first control signal at a leading edge of the third control signal.

In one embodiment, the step of outputting the coarse lock detection signal includes outputting the coarse lock detection signal at a leading edge of the fifth control signal.

BRIEF DESCRIPTION OF THE DRAWINGS

The foregoing and other features and advantages of the invention will be apparent from the more particular description of an embodiment of the invention, as illustrated in the accompanying drawing. The drawing is not necessarily to scale, emphasis instead being placed upon illustrating the principles of the invention. Like reference characters refer to like elements throughout the drawings.

DESCRIPTION OF THE EXEMPLARY EMBODIMENTS

Figure 1:
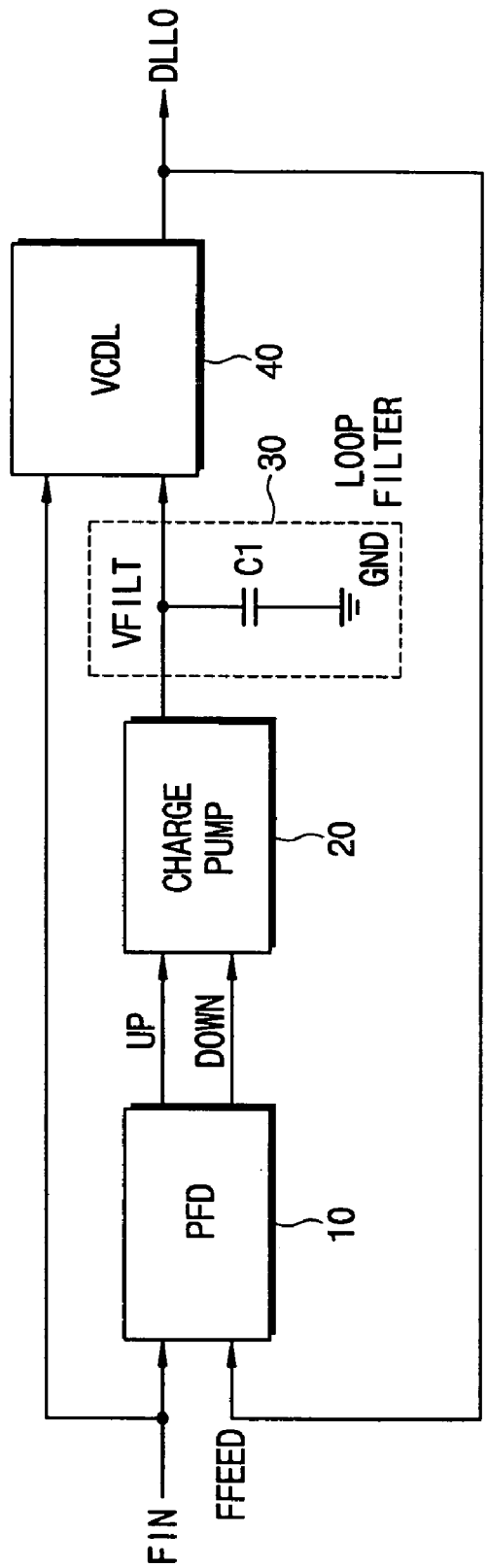
FIG. 1 is a schematic block diagram illustrating a conventional delay-locked loop circuit.
Figure 2A:
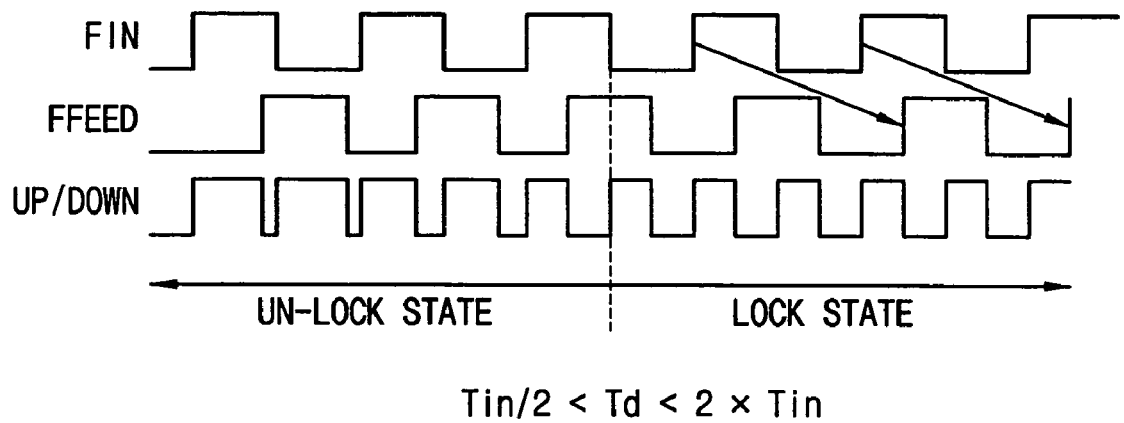
FIGS. 2A through 2D are timing diagrams illustrating locked states according to conditions of delay times in the conventional DLL circuit of FIG. 1.
Figure 2B:
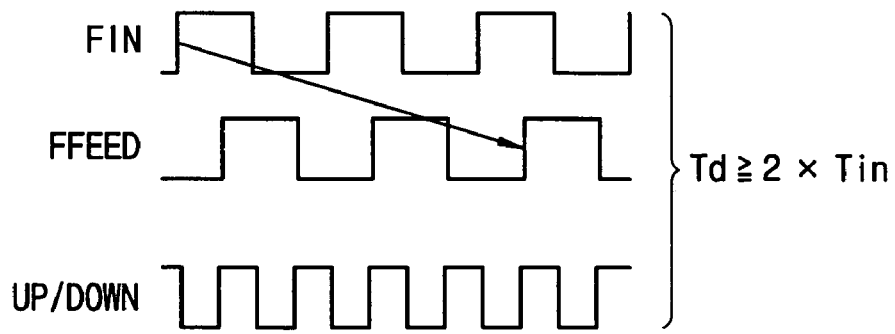
Figure 2C:
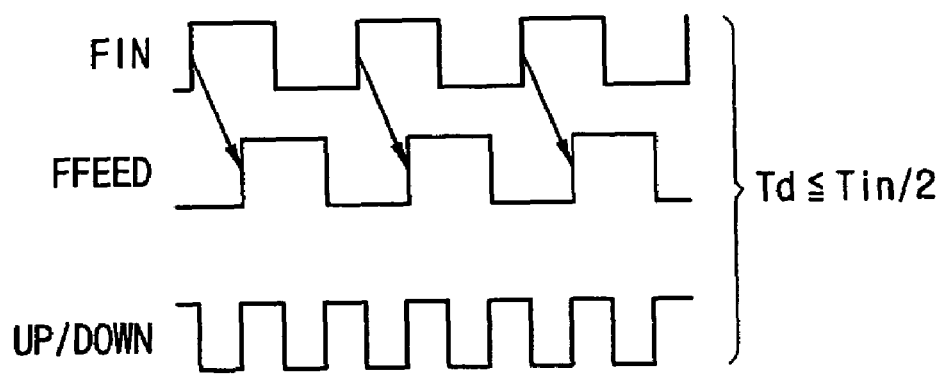
Figure 2D:
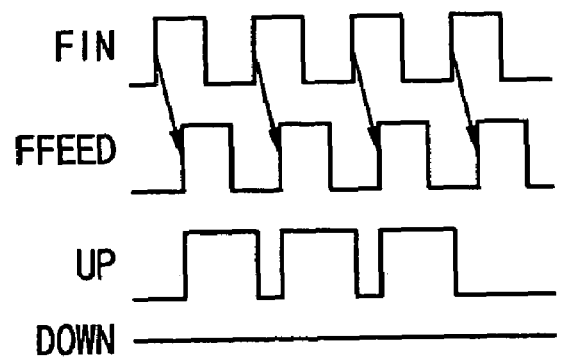
Figure 3:
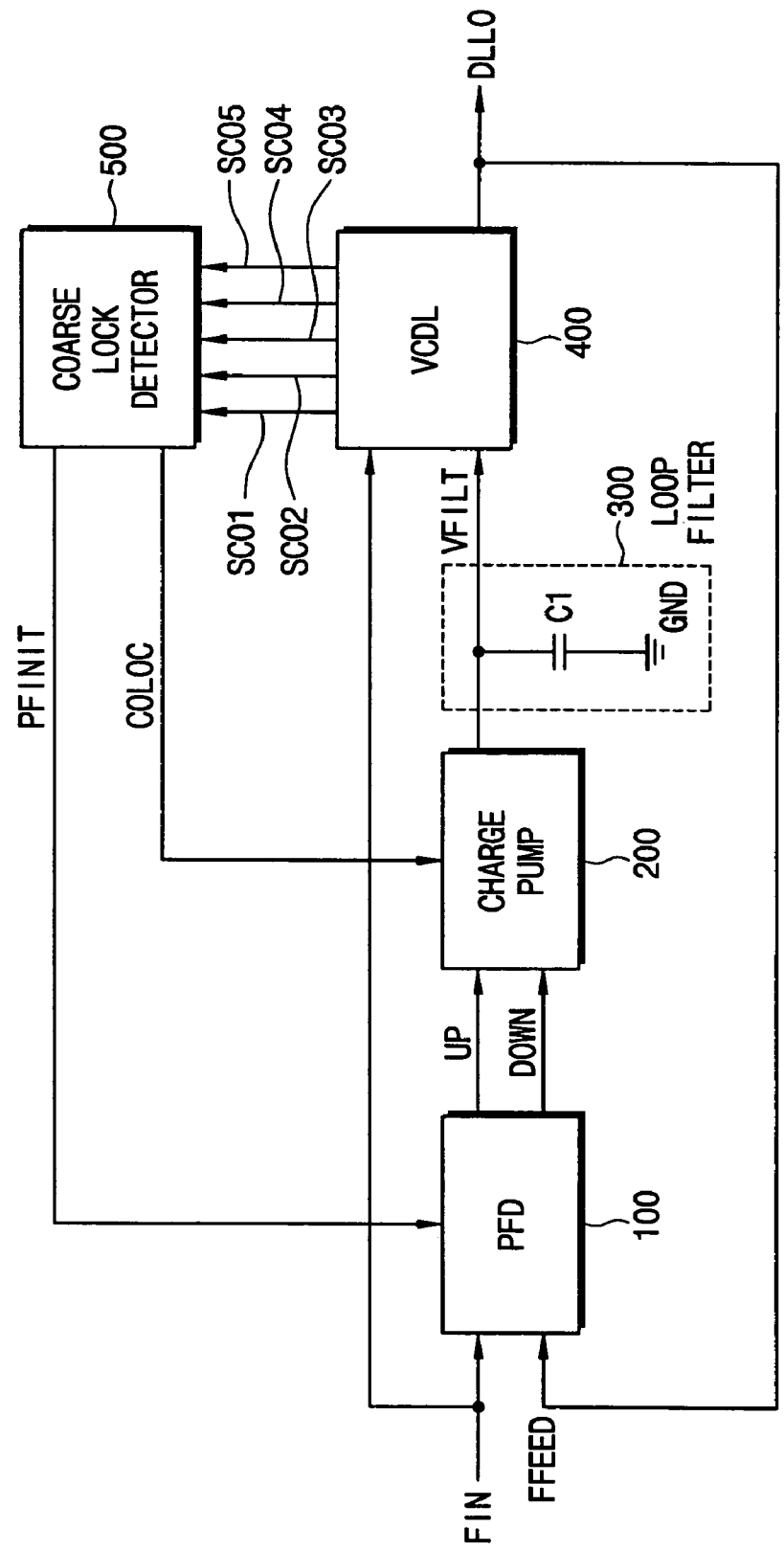
FIG. 3 is a schematic block diagram illustrating a delay-locked loop circuit according to an exemplary embodiment of the present invention.

FIG. 3 is a schematic block diagram illustrating a delay-locked loop circuit according to an exemplary embodiment of the present invention.

Referring to FIG. 3, the DLL circuit includes a PFD 100, a charge pump circuit 200, a loop filter 300, a VCDL 400 and a coarse lock detector 500.

The PFD 100 receives an input clock signal FIN, a feedback signal FFEED and an initialization signal PFINIT, and detects phase difference between the received input clock signal FIN and the feedback signal FFEED to generate an up signal UP or a down signal DOWN according to the resulting phase difference. The charge pump circuit 200 receives the up signal UP, the down signal DOWN and a coarse lock detection signal COLOC to generate a current signal that varies with the up signal UP, the down signal DOWN and the coarse lock detection signal COLOC. The loop filter 300 receives the current signal from the charge pump circuit 200 and filters the current signal through low-pass filtering to generate a dc voltage signal VFILT. The loop filter 300 may comprise a capacitor Cl. The VCDL 400 receives the input clock signal FIN and the dc voltage signal VFILT and delays the input clock signal FIN by predetermined period in response to the dc voltage signal VFILT. The delayed signal from the VCDL 400 becomes an output signal DLLO and the feedback signal FFEED.

The coarse lock detector 500 receives the first through fifth control signals SCO1~SCO5 from the VCDL 400 to generate the initialization signal PFINIT for initializing the PFD 100 and the coarse lock detection signal COLOC.

Figure 4:
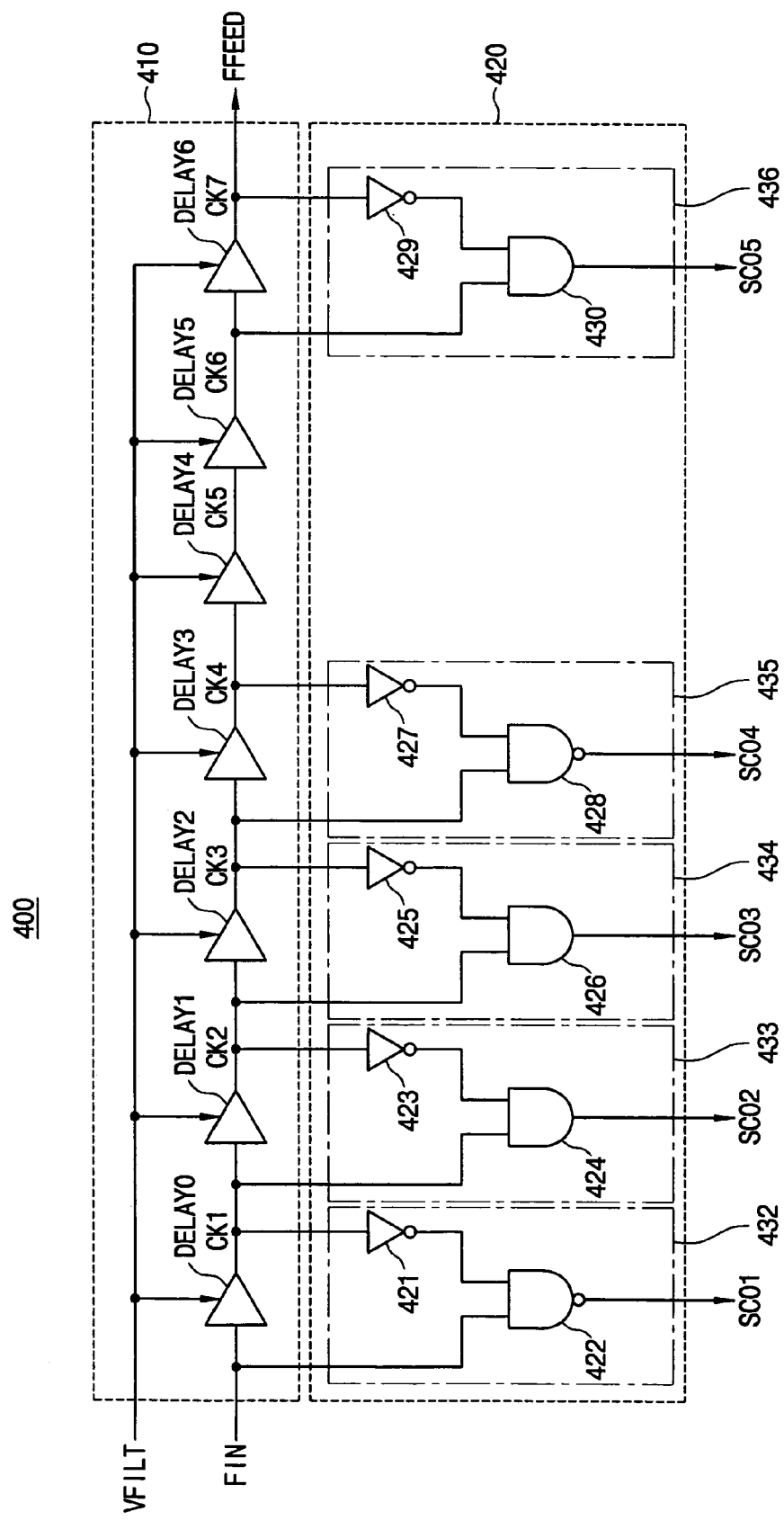
FIG. 4 is a detailed circuit diagram illustrating a VCDL of the delay-locked loop circuit of FIG. 3.

FIG. 4 is a detailed circuit diagram illustrating the VCDL 400 of the delay-locked loop circuit of FIG. 3.

Referring to FIG. 4, the VCDL 400 includes a delay section 410 and a control signal generator 420. The control signal generator 420 includes a first through fifth control signal generating circuits 432~436.

The delay section 410 has first through seventh delay elements DELAY0~DELAY6, which are cascade-connected and delay the received signal by the predetermined period in response to the dc voltage signal VFILT. Although the delay section 410 includes seven delay elements in FIG. 4, the delay section may have another arbitrary N number of delay elements.

The first control signal generating circuit 432 includes an inverter 421 and a NAND gate 422. The inverter 421 inverts an output signal CK1 of the first delay element DELAY0. The NAND gate 422 receives an input signal FIN of the first delay element DELAY0 and an output signal of the inverter 421 to perform a logical NAND operation.

The second control signal generating circuit 433 includes an inverter 423 and an AND gate 424. The inverter 423 inverts an output signal CK2 of the second delay element DELAY1. The AND gate 424 receives an input signal CK1 of the second delay element DELAY1 and an output signal of the inverter 423 to perform a logical AND operation.

The third control signal generating circuit 434 includes an inverter 425 and an AND gate 426. The inverter 425 inverts an output signal CK3 of the third delay element DELAY2. The AND gate 426 receives an input signal CK2 of the third delay element DELAY2 and an output signal of the inverter 425 to perform the logical AND operation.

The fourth control signal generating circuit 435 includes an inverter 427 and a NAND gate 428. The inverter 427 inverts an output signal CK4 of the fourth delay element DELAY3. The NAND gate 428 receives an input signal CK3 of the fourth delay element DELAY3 and an output signal of the inverter 427 to perform the logical NAND operation.

The fifth control signal generating circuit 436 includes an inverter 429 and an AND gate 430. The inverter 429 inverts an output signal CK7 of the seventh delay element DELAY6. The AND gate 430 receives an input signal CK6 of the seventh delay element DELAY6 and an output signal of the inverter 429 to perform the logical AND operation.

Figure 5:
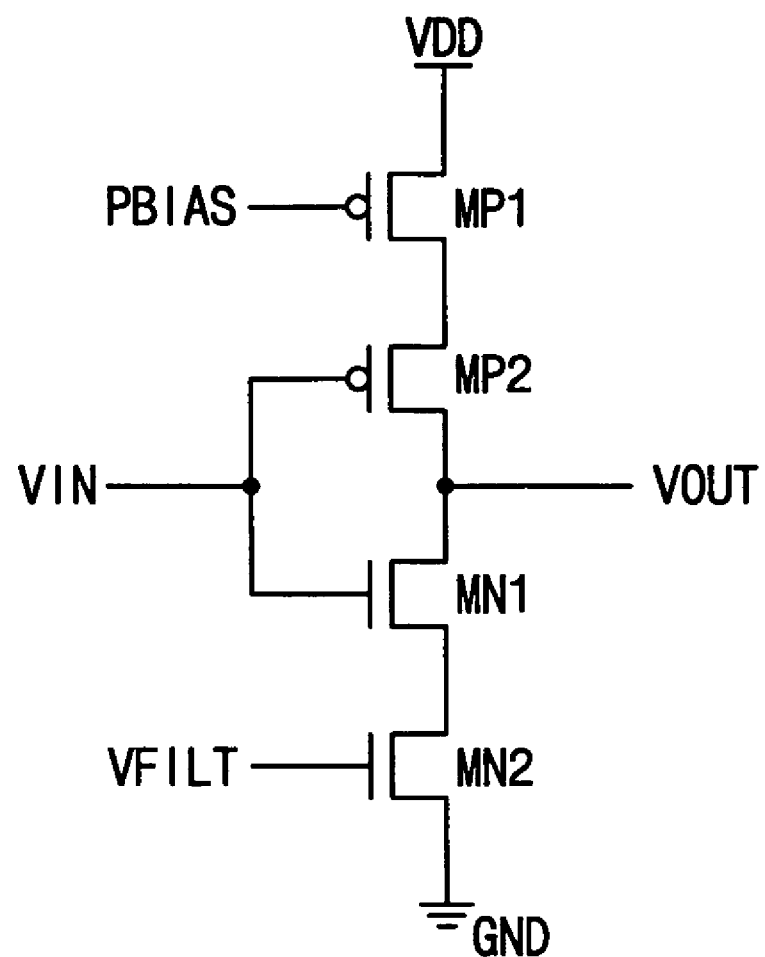
FIG. 5 is a view illustrating in more detail a delay element of the VCDL of FIG. 4.

FIG. 5 is a view illustrating in more detail the delay element of the VCDL of FIG. 4. Referring to FIG. 5, each of delay elements DELAY0~DELAY6 includes a first PMOS transistor MP1, second PMOS transistor MP2, first NMOS transistor MN1 and second NMOS transistor MN2. The PMOS transistors MP1 and MP2 and the NMOS transistors MN1 and MN2 are coupled in series between a power source voltage VDD and a ground voltage GND. The first PMOS transistor MP1 has a source which is coupled to the power source voltage VDD and a gate to which a bias voltage PBIAS is applied. The second PMOS transistor MP2 has a source coupled to a drain of the first PMOS transistor MP1. The second PMOS transistor MP2 and the first NMOS transistor MN1 whose gates are coupled in common and whose drains are coupled in common form an inverter to receive an input signal VIN to provide an output signal VOUT. The second NMOS transistor MN2 has a drain coupled to a source of the first NMOS transistor MN1, a gate to which the dc voltage signal VFILT is applied, and a source coupled to the ground voltage GND.

The delay element of FIG. 5 operates as an inverter by the second PMOS transistor MP2 and the first NMOS transistor MN1. When a- magnitude of the dc voltage signal VFILT increases, the time period from input to output of the input signal VIN decreases. When the magnitude of the direct voltage signal VFILT decreases, the time period from input to output of the input signal VIN increases.

Figure 6:
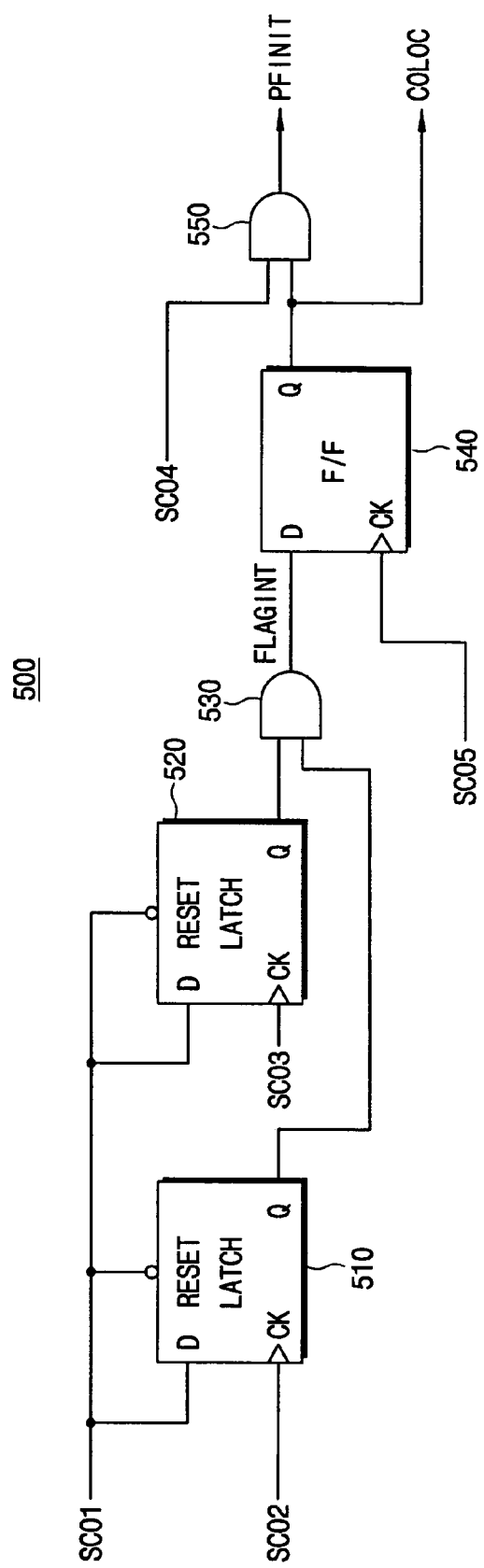
FIG. 6 is a detailed circuit diagram illustrating a coarse lock detector of the delay-locked loop circuit of FIG. 3.

FIG. 6 is a detailed circuit diagram illustrating a coarse lock detector 500 of the delay-locked loop circuit of FIG. 3. Referring to FIG. 6, the coarse lock detector 500 includes a first latch circuit 510, a second latch circuit 520, a first AND gate 530 and a D-type flip-flop circuit 540 and a second AND gate 550.

The first latch circuit 510 has an input terminal D to which a first control signal SCO1 is applied, a reset terminal RESET, a clock terminal CK to which a second control signal SCO2 is applied, and an output terminal Q. The first latch circuit 510 latches the first control signal SCO1 at a rising edge of the second control signal SCO2.

The second latch circuit 520 has an input terminal D to which the first control signal SCO1 is applied, a reset terminal RESET, a clock terminal CK to which a third control signal SCO3 is applied, and an output terminal Q. The second latch circuit 520 latches the first control signal SCO1 at a rising edge of the third control signal SCO3. The first and second latch circuits 510 and 520 are reset when the first control signal SCO1 is in a low state, since the reset terminals of the first and second latch circuits 510 and 520 are activated in the low states.

The first AND gate 530 receives output signals from the first and second latch circuits 510 and 520 to perform the logical AND operation. The D-type flip-flop circuit 540 includes an input terminal D to which an output signal FLAGINT of the first AND gate 530 is applied, and a clock terminal CK to which a fifth control signal SCO5 is applied, and an output terminal Q. The D-type flip-flop circuit 540 outputs the coarse lock detection signal COLOC at a rising edge of the fifth control signal SCO5. The second AND gate 550 receives the coarse lock detection signal COLOC and the fourth control signal SCO4 to perform the logical AND operation, and outputs the initialization signal PFINIT.

Figure 7:
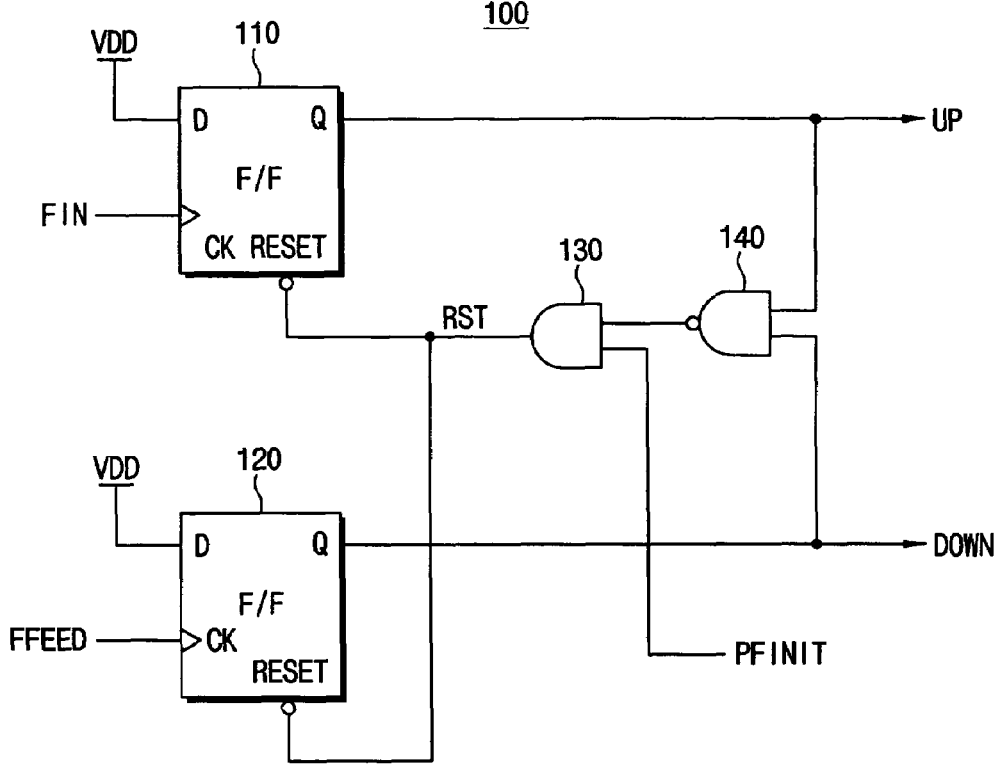
FIG. 7 is a detailed circuit diagram illustrating a PFD of the delay-locked loop circuit of FIG. 3.

FIG. 7 is a detailed circuit diagram illustrating a PFD 100 of the delay-locked loop circuit of FIG. 3. Referring to FIG. 7, the PFD includes a first D-type flip-flop circuit 110, a second D-flip-flop circuit 120, a NAND gate 140 and an AND gate 130.

The first D-type flip-flop circuit 110 includes an input terminal D to which a signal having a high logic is applied, a clock terminal CK to which the input signal FIN is applied, a reset terminal RESET to which a reset signal RST is applied, and an output terminal Q for outputting the up signal UP. The second D-type flip-flop circuit 120 includes an input terminal D to which a signal having a high logic is applied, a clock terminal CK to which the input signal FFEED is applied, a reset terminal RESET to which a reset signal RST is applied, and an output terminal Q for outputting the down signal DOWN. The reset terminals of the first and second D-type flip-flop circuits 110 and 120 are activated in the low state. The NAND gate 140 receives the up signal UP and the down signal DOWN to perform the logical NAND operation. The AND gate 130 receives an output signal of the NAND gate 140 and the initialization signal PFINIT to perform the logical AND operation and outputs the reset signal RST.

Figure 8:
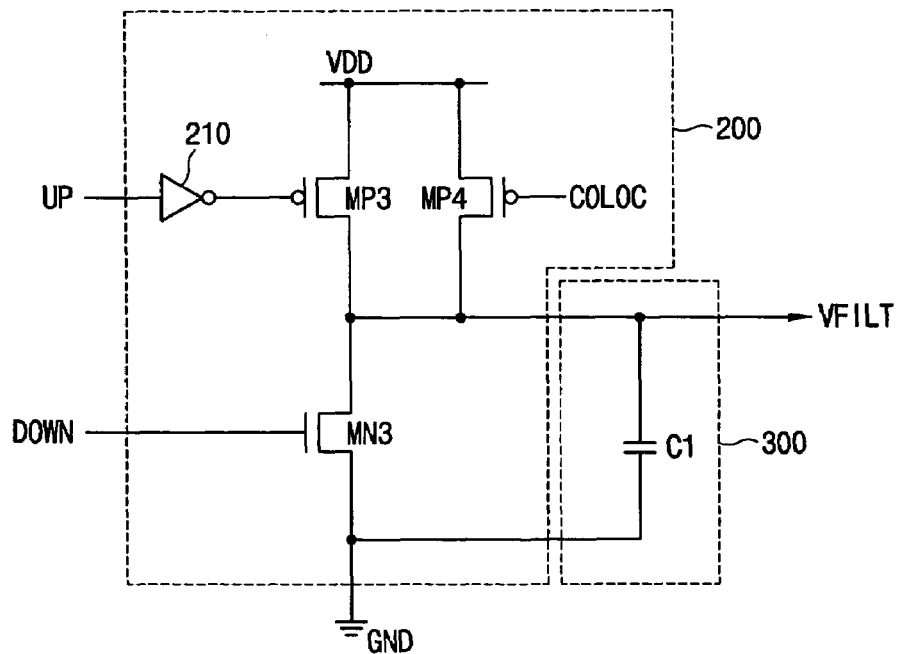
FIG. 8 is a detailed circuit diagram illustrating a charge pump and a loop filter of the delay-locked loop circuit of FIG. 3.

FIG. 8 is a detailed circuit diagram illustrating a charge pump 200 and a loop filter 300 of the delay-locked loop circuit of FIG. 3. Referring to FIG. 8, the charge pump 200 includes an inverter 210, a first PMOS transistor MP3, an NMOS transistor MN3, and a second PMOS transistor MP4. The inverter 210 inverts the up signal UP, and the first PMOS transistor MP3 has a source coupled to a power source voltage VDD, a gate coupled to an output terminal of the inverter 210 and a drain for outputting the dc voltage signal VFILT. The NMOS transistor MN3 has a drain coupled to the drain of the first PMOS transistor MP3, a gate to which the down signal DOWN is applied, and a source coupled to a ground voltage GND. The second PMOS transistor MP4 has a source coupled to the power source voltage VDD, a gate to which the coarse lock detection signal COLOC is applied, and a drain coupled to the drain of the first PMOS transistor MP3. The loop filter 300 may comprise a capacitor C1 connected between the drain of the first PMOS transistor MP3 and the ground voltage GND.

Figure 9A:
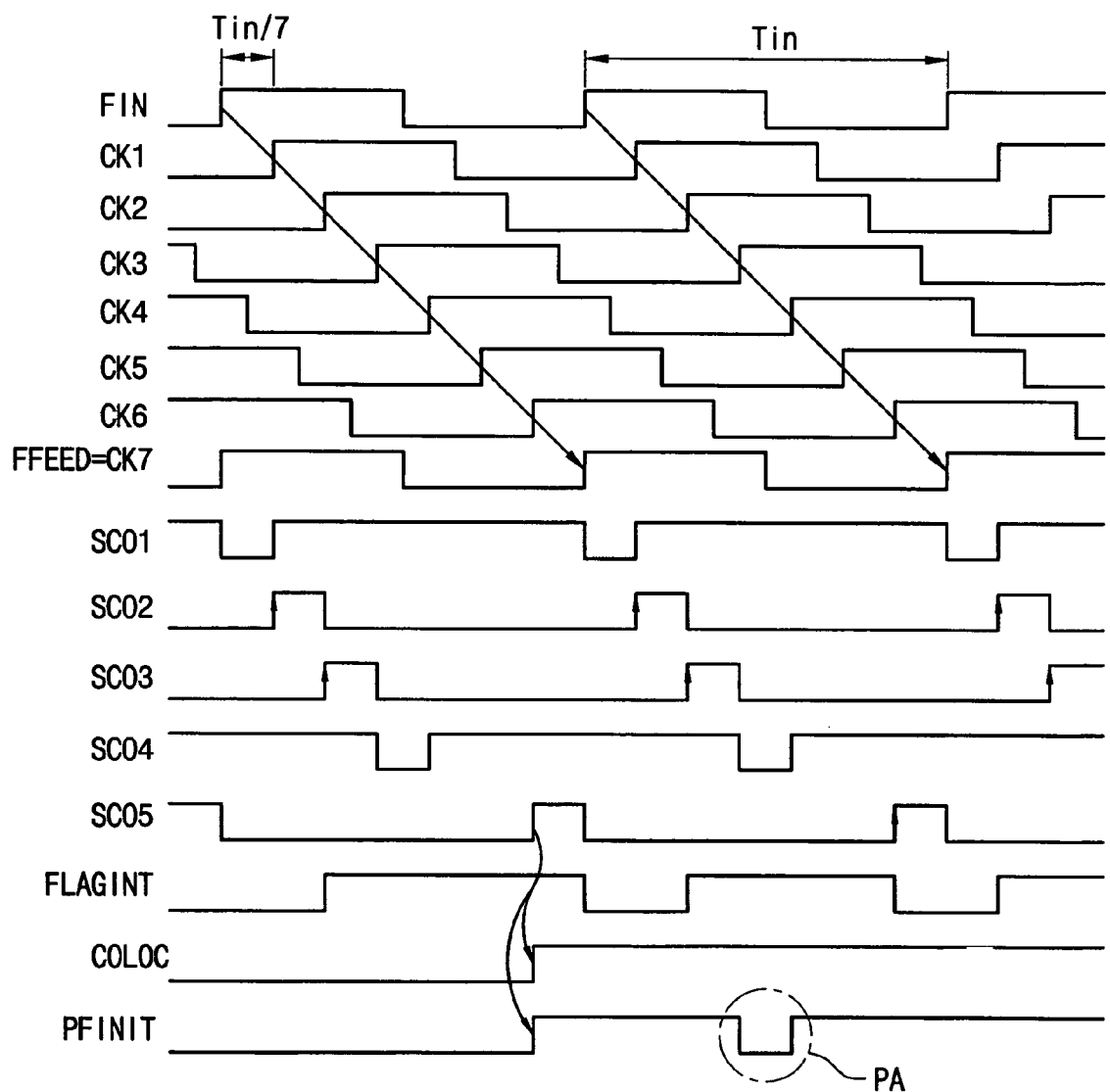
FIGS. 9A through 9C are timing diagrams for the delay-locked loop circuit in achieving or failing to a coarse lock according to the conditions of delay times.
Figure 9B:
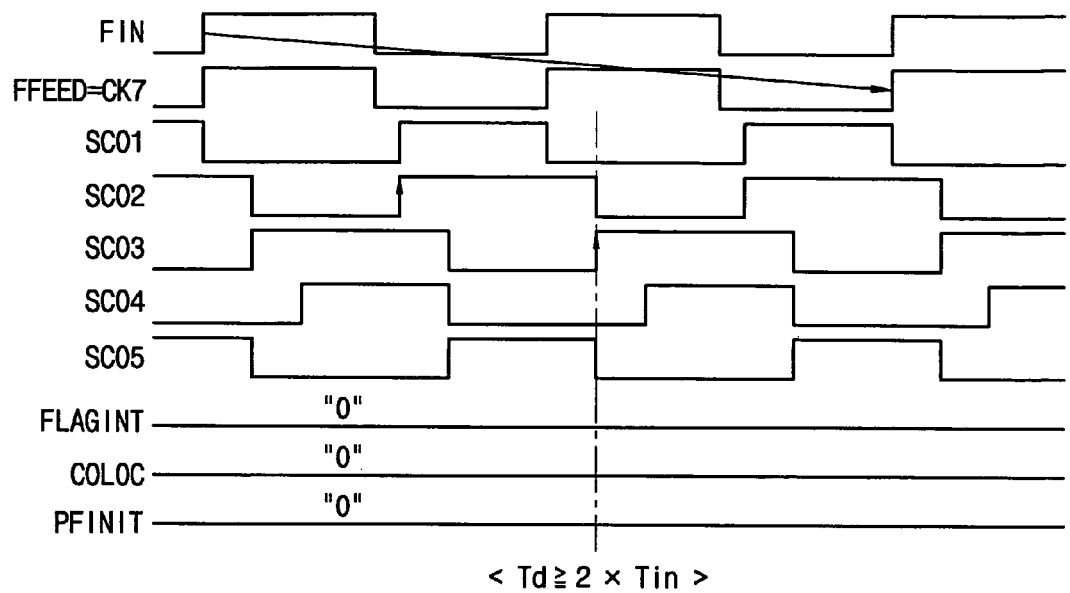
Figure 9C:
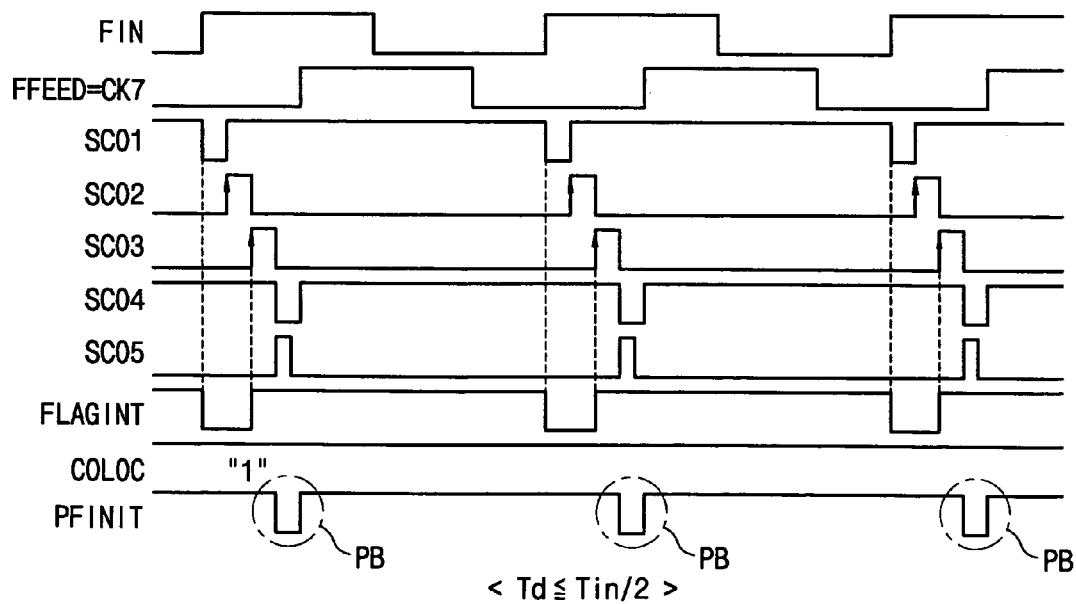

FIGS. 9A through 9C are timing diagrams for the delay-locked loop circuit in achieving or not achieving a coarse lock according to the conditions of delay times.

Referring to FIGS. 3 through 9C, operation of the delay-locked loop circuit according to at least one exemplary embodiment of the present invention will be described hereinafter.

The lock process of the DLL according to the present invention comprises a coarse lock process and a fine lock process. In the coarse lock process, a coarse lock detection signal and an initialization signal are generated using multi-phase signals that are generated by the delay elements of the VCDL, and whether a coarse lock is achieved is determined based on logic states of the coarse lock detection signal and the initialization signal. After the coarse lock is achieved, the PFD is operated so that a fine lock may be achieved. In addition, in order to prevent the PFD from being in a deadlock state, the initialization signal PFINIT, which initializes the PFD, is inserted in the middle of an overall delay time.

The coarse lock process will be further described, hereinafter.

In FIG. 9A, the DLL is locked when Tin/2<Td<2×Tin. As shown in FIG. 9A, when the seven delay elements DELAY0~DELAY6 are used, the multi-phase signal of VCDL may have a unit delay time corresponding to an increment of one seventh (1/7) of a clock period of the input clock signal FIN. Waveforms of the first through fifth control signals SCO1~SCO5 generated and outputted from the VCDL 400 of FIG. 4 are as illustrated in FIG. 9A. The coarse lock detector 500 of FIG. 6 receives the fist through fifth control signals SCO1~SCO5 to generate the coarse lock detection signal COLOC and the initialization signal PFINIT. When the first control signal SCO1 is in a high state, an output of the latch circuit 510 has the high state at a rising edge of the second control signal SCO2. When the first control signal SCO1 is in the high state, an output of the latch circuit 520 has the high state at a rising edge of the third control signal SCO3. As shown in FIG. 9A, the coarse lock detection signal COLOC and the initialization PFINIT are generated at a rising edge of the fifth control signal SCO5 when the first control signal SCO1 has the high state.

That is, the coarse lock of the DLL is achieved from time point corresponding to 6/7 of clock period of the input clock signal FIN. A low pulse PA is inserted after the initialization signal PFINIT is changed to the high state to initialize the PFD within an overall delay time, and thus deadlock may be prevented.

FIG. 9B shows the delay-locked circuit failing to lock when Td≧2×Tin. When time period Td is twice clock period of the input clock signal FIN, the unit delay time (Tin/7) is doubled. As shown in FIG. 9B, the latch circuits 510 and 520 are reset in response to the first control signal SCO1 before an input signal FLAGINT, applied to an input terminal D of the D-type flip-flop, is changed to the high state in response to the second and third control signals SCO2 and SCO3. Therefore, the coarse lock detection signal COLOC has a low state.

Referring to FIG. 8, when the coarse lock detection signal COLOC has the low state, the charge pump 200 provides electric charges to a capacitor C1 of the loop filter 300, thereby increasing the dc voltage signal VFILT. As a result, delay time of the delay elements DELAY0~DELAY6 of the VCDL 400 shown in FIG. 4 decreases. When Td≧2×Tin, the initialization signal PFINIT is in the low state as shown in FIG. 9B. Referring to FIG. 7, when the initialization signal PFINIT is in the low state, the D-type flip-flop circuits 110 and 120 are reset, and thus the up signal UP and the down signal DOWN have the low states. Accordingly, states of the input clock signal FIN and the feedback signal FFEED do not affect a level of the dc voltage signal VFILT.

In FIG. 9C, the DLL fails to lock when Td≦Tin/2. As shown in FIG. 9C, when the first control signal SCO1 is in a high state, an input signal FLAGINT, applied from the AND gate 530 to the input terminal D of the D-type flip-flop circuit 540, is changed to the high state in response to the second and third control signals SCO2 and SCO3. Therefore, the coarse lock detection signal COLOC has the high state, and the second PMOS transistor MP4 no longer provides a current to the loop filter 300. In this case, the initialization signal PFINIT has the high state, and a low pulse PB may be generated according to a logic state of the fourth control signal SCO4. Referring to FIG. 7, when the initialization signal PFINIT is in the low state, the D-type flip-flops 110 and 120 are reset, and the up signal UP and the down signal DOWN have the low state. Therefore, states of the input clock signal FIN and the feedback signal FFEED do not affect a level of the dc voltage signal VFILT. Thus, the PFD 100 is initialized within an overall delay time, and deadlock may be prevented.

Figure 10A:
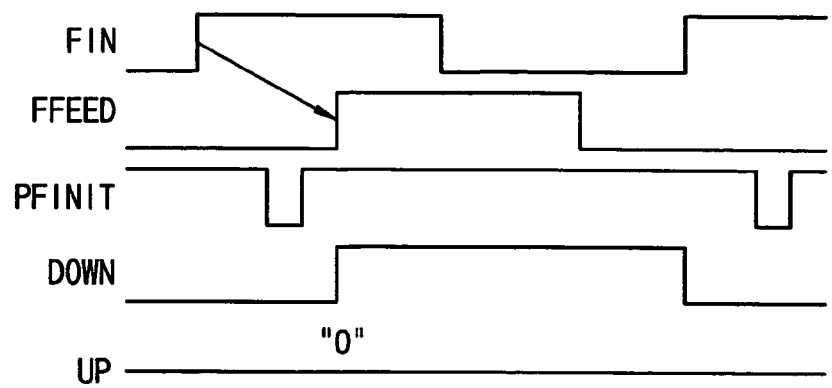
FIGS. 10A through 10C are timing diagrams illustrating processes of achieving a fine lock of the delay-locked loop circuit.
Figure 10B:
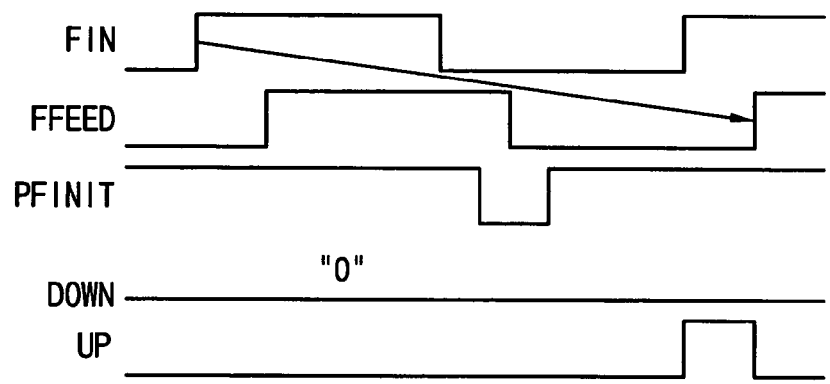
Figure 10C:
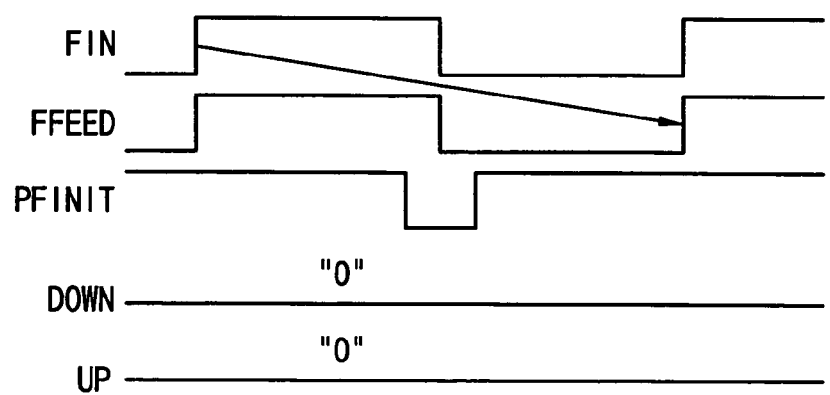

FIGS. 10A through 10C are timing diagrams illustrating an operation process of the delay-locked loop circuit achieving a fine lock.

FIG. 10A shows that the DLL achieves a locked state in a case in which delay time is shorter than a clock period of the input clock signal FIN. FIG. 10B shows that the DLL achieves a locked state in a case in which the delay time is longer than the clock period of the input clock signal FIN. FIG. 10C indicates that the DLL achieves a fine lock. As shown in FIG. 10A, when the delay time is shorter than the clock period of the input clock signal FIN, the down signal DOWN is changed to a high state, thereby decreasing the dc voltage signal VFILT and increasing the delay time in the VCDL 400. As shown in FIG. 10B, when the delay time is longer than the clock period of the input clock signal FIN, the up signal UP is changed to the high state, thereby increasing the dc voltage signal VFILT and decreasing the delay time of VCDL. As shown in FIG. 10C, the initialization signal PFINIT of the low pulse is generated within the overall delay time. When the initialization signal PFINIT is in the low state, the PFD 100 is initialized so that the deadlock may be prevented and the normal operation of PFD may be assured.

Figure 11:
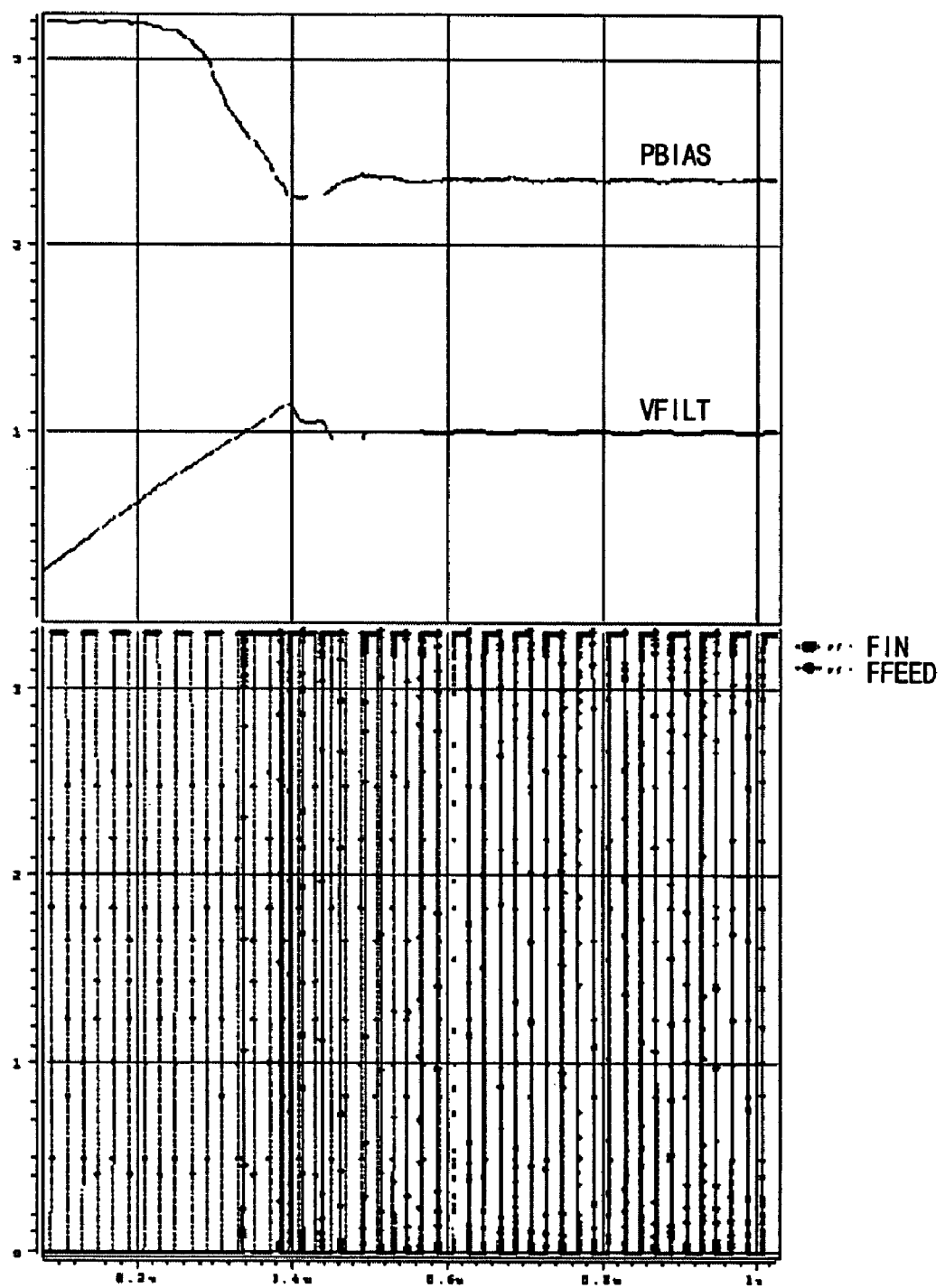
FIG. 11 is a view illustrating simulation results for the delay-locked loop circuit of FIG. 3 when an input clock signal has a frequency of 25 MHz.
Figure 12:
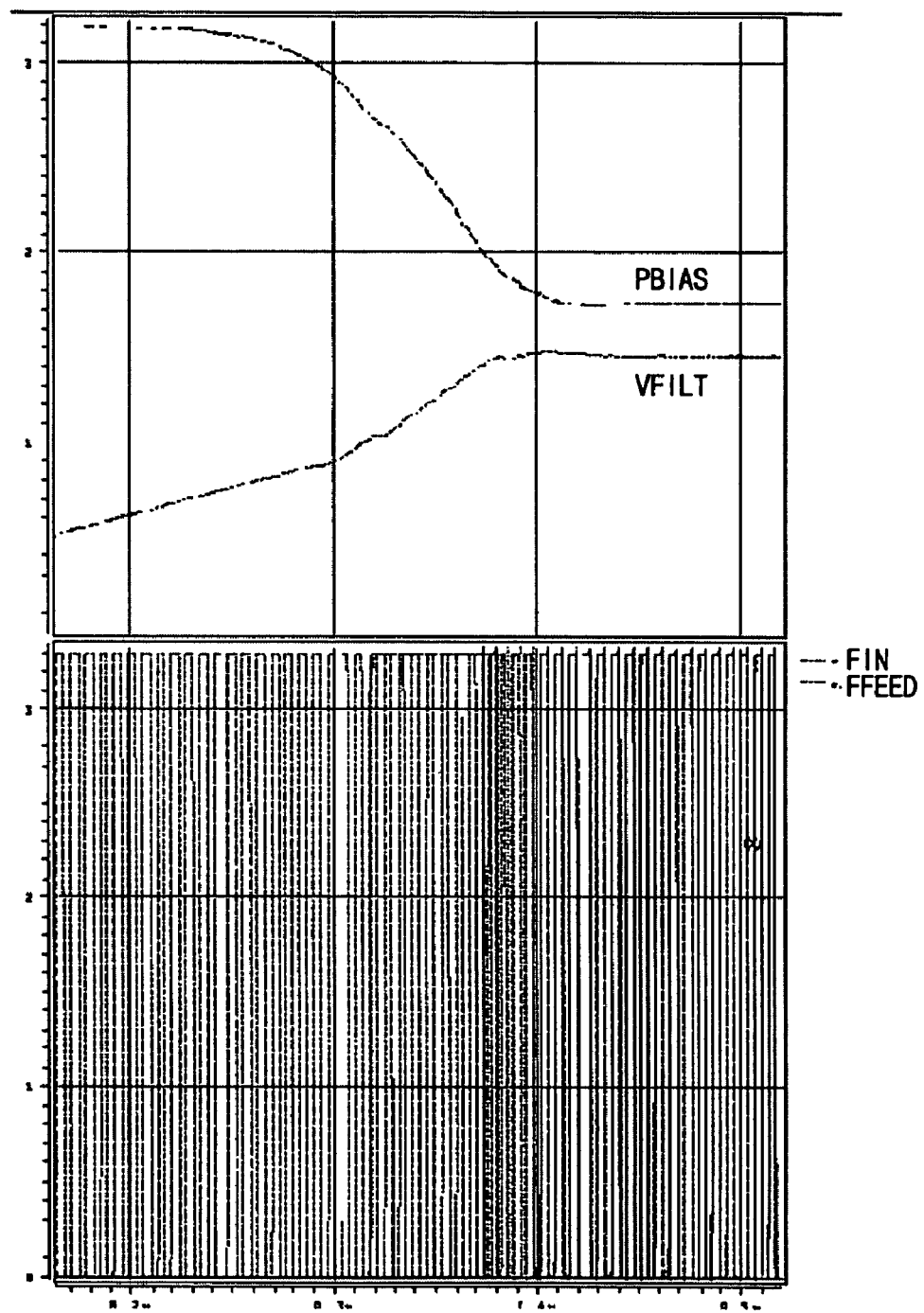
FIG. 12 is a view illustrating simulation results for the delay-locked loop circuit of FIG. 3 when the input clock signal has a frequency of 142 MHz.

FIG. 11 is a view illustrating simulation results for the delay-locked loop circuit of FIG. 3 when an input clock signal has a frequency of 25 MHz, and FIG. 12 is a view illustrating simulation results for the delay-locked loop circuit of FIG. 3 when the input clock signal has a frequency of 142 MHz.

As shown in FIG. 11, when the input clock signal has the frequency of 25 MHz, the dc voltage signal VFILT is stabilized and the DLL is locked at the time of T=0.6 us. In addition, the delay time is exactly identical to the clock period of the input clock signal. As shown in FIG. 12, when the input clock signal has the frequency of 142 MHz, the dc voltage signal VFILT is stabilized and the DLL is locked at the time of T=0.5 us. In addition, the delay time is exactly identical to the clock period of the input clock signal.

As described above, according to the delay-lock loop circuit of the present invention, when the delay time Td satisfies the relationship of Td≧2×Tin or Td≦Tin/2, the coarse lock detection signal and the initialization signal are generated so that the delay time Td may be adjusted within Tin/2<Td<2×Tin: Hence, the delay-lock loop circuit of the present invention may avoid a harmonic lock, and may stably have lock state.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A delay-locked loop circuit comprising: a phase frequency detector configured to receive an input clock signal, a feedback signal and an initialization signal, and configured to generate an up signal and a down signal according to a phase difference and a frequency difference between the input clock signal and the feedback signal, upon control of the initialization signal;

a charge pump configured to receive the up signal, the down signal and a coarse lock detection signal, and configured to generate a current signal that varies with states of the up signal, the down signal and the coarse lock detection signal;

a loop filter configured to receive the current signal from the charge pump circuit, and configured to filter the current signal through a low-pass filter to generate a dc voltage signal;

a voltage controlled delay line configured to receive the input clock signal and the dc voltage signal, and configured to generate the feedback signal and control signals in response to the dc voltage signal, the feedback signal being obtained by delaying the input clock signal by a predetermined period, and the control signals having different phase; and a coarse lock detector configured to receive the control signals from the voltage controlled delay line and configured to generate the initialization signal and the coarse lock detection signal to control the phase frequency detector and the charge pump circuit so that Td is adjustable within a range of Tin/2<Td<2×Tin when Td is smaller than Tin/2 or greater than twice Tin, wherein Tin represents a period of the input clock signal and Td represents a delay time thereof.

2. The delay-locked loop circuit of claim 1, wherein the voltage controlled delay line includes:
  a delay section configured to have first through N-th delay elements which are cascade-connected to delay the input clock signal by a predetermined period in response to the dc voltage signal; and
  a control signal generator configured to generate first through fifth control signals using a portion of input signals and output signals of the N delay elements.

3. The delay-locked loop circuit of claim 2, wherein the control signal generator includes:
  a first control signal generating circuit configured to generate the first control signal based on the input signal and the output signal of the first delay element;
  a second control signal generating circuit configured to generate the second control signal based on the input signal and the output signal of the second delay element;
  a third control signal generating circuit configured to generate the third control signal based on the input signal and the output signal of the third delay element;
  a fourth control signal generating circuit configured to generate the fourth control signal based on the input signal and the output signal of the fourth delay element; and
  a fifth control signal generating circuit configured to generate the fifth control signal based on the input signal and the output signal of the N-th delay element.

4. The delay-locked loop circuit of claim 2, wherein N is 7.

5. The delay-locked loop circuit of claim 3, wherein N is 7.

6. The delay-locked loop circuit of claim 3, wherein the first control signal generating circuit includes:
  an inverter configured to invert an output signal of the first delay element; and
  a NAND gate configured to receive the input signal of the first delay element and an output signal of the inverter to perform a logical NAND operation.

7. The delay-locked loop circuit of claim 3, wherein the second control signal generating circuit includes:
  an inverter configured to invert an output signal of the second delay element; and
  a NAND gate configured to receive the input signal of the second delay element and an output signal of the inverter to perform a logical NAND operation.

8. The delay-locked loop circuit of claim 3, wherein the third control signal generating circuit includes:
  an inverter configured to invert an output signal of the third delay element; and
  a NAND gate configured to receive the input signal of the third delay element and an output signal of the inverter to perform a logical NAND operation.

9. The delay-locked loop circuit of claim 3, wherein the fourth control signal generating circuit includes:
  an inverter configured to invert an output signal of the fourth delay element; and
  a NAND gate configured to receive the input signal of the fourth delay element and an output signal of the inverter to perform a logical NAND operation.

10. The delay-locked loop circuit of claim 3, wherein the fifth control signal generating circuit includes:
  an inverter configured to invert an output signal of the Nth delay element; and
  a NAND gate configured to receive the input signal of the Nth delay element and an output signal of the inverter to perform a logical NAND operation.

11. The delay-locked loop circuit of claim 2, wherein each of the delay elements includes:
  a first PMOS transistor configured to have its source coupled to a first power source voltage, and to have its gate have a bias voltage applied;
  a second PMOS transistor configured to have its source coupled to a drain of the first PMOS transistor and to have its gate have an input signal applied;
  a first NMOS transistor configured to have its drain coupled to a drain of the second PMOS transistor to provide an output signal, and to have its gate have the input signal applied; and
  a second NMOS transistor configured to have its drain coupled to a source of the first NMOS transistor, to have its gate have the dc voltage signal applied, and to have its source coupled to a second power voltage.

12. The delay-locked loop circuit of claim 2, wherein the coarse lock detector includes:
  a first latch circuit configured to have an input terminal, a reset terminal to which the first control signal is applied, a clock terminal to which the second control signal is applied, and an output terminal, to latch the first control signal in response to the second control signal;
  a second latch circuit configured to have an input terminal, a reset terminal to which the first control signal is applied, a clock terminal to which the third control signal is applied, and an output terminal, to latch the first control signal in response to the third control signal;
  a first AND gate configured to receive an output signal of the first latch circuit and an output signal of the second latch circuit to perform a logical AND operation;
  a flip-flop circuit configured to have an input terminal to which the first AND gate is applied, a clock terminal to which the fifth control signal is applied, and an output terminal, to output the coarse lock detection signal in response to the fifth control signal; and
  a second AND gate configured to receive the coarse lock detection signal and the fourth control signal to perform a logical AND operation and configured to output the initialization signal.

13. The delay-locked loop circuit of claim 12, wherein the first latch circuit latches the first control signal at a leading edge of the second control signal, and the second latch circuit latches the first control signal at a leading edge of the third control signal.

14. The delay-locked loop circuit of claim 12, wherein the flip-flop circuit outputs the coarse lock detection signal at a leading edge of the fifth control signal.

15. The delay-locked loop circuit of claim 1, wherein the phase frequency detector includes:
  a first flip-flop circuit configured to have an input terminal to which a signal having a first state is applied, a clock terminal to which the input clock signal is applied, a reset terminal to which a reset signal is applied, and an output terminal for outputting the up signal;
  a second flip-flop circuit configured to have an input terminal to which the signal having the first state is applied, a clock terminal to which the feedback signal is applied, a reset terminal to which the reset signal is applied, and an output terminal for outputting the down signal;
  a NAND gate configured to receive the up signal and the down signal to perform a logical NAND operation; and an AND gate configured to receive an output signal of the NAND gate and the initialization signal to perform a logical AND operation and configured to output the reset signal.

16. The delay-locked loop circuit of claim 1, wherein the charge pump circuit includes:
an inverter configured to invert the up signal;
a first PMOS transistor configured to have its source coupled to a first power source voltage, its gate coupled to an output terminal of the inverter and its drain coupled to the dc voltage signal;
an NMOS transistor configured to have its drain coupled to the dc voltage signal, its gate to which the down signal is applied, and its source coupled to a second power source voltage; and
a second PMOS transistor configured to have its source coupled to the first power source voltage, to have its gate have the coarse lock detection signal applied, and its drain coupled to the dc voltage signal.

17. The delay-locked loop circuit of claim 16, wherein the loop filter includes a capacitor coupled between the drain of the first PMOS transistor and the second power source voltage.

18. A method of generating a clock signal comprising:
receiving an input clock signal, a feedback signal and an initialization signal to generate an up signal and a down signal according to a phase difference and a frequency difference between the input clock signal and the feedback signal, upon control of the initialization signal;
receiving the up signal, the down signal and a coarse lock detection signal to generate a current signal that varies with states of the up signal, the down signal and a coarse lock detection signal,
receiving the current signal and filtering the current signal through a low-pass filter to generate a dc voltage signal;
receiving the input clock signal and the dc voltage signal to generate the feedback signal and first through fifth control signals in response to the dc voltage signal, the feedback signal being obtained by delaying the input clock signal by a predetermined period and the control signals having different phase; and
receiving the first through fifth control signals to generate the initialization signal and the coarse lock detection signal to adjust Td within Tin/2<Td<2×Tin when Td is smaller than Tin/2 or greater than twice Tin, Tin representing a clock period of the input clock signal and the Td representing a delay time thereof.

19. The method of claim 18, wherein the step of generating the initialization signal and the coarse lock detection signal includes:
latching the first control signal in response to the second control signal to output a first signal;
latching the first control signal in response to the third control signal to output a second signal;
receiving the first and second signals to perform a logical AND operation, thereby outputting a third signal;
receiving the third signal to output the coarse lock detection signal in response to the fifth control signal; and
receiving the coarse lock detection signal and the fourth control signal to perform the logical AND operation, thereby generating the initialization signal.

20. The method of claim 19, wherein the step of latching the first control signal in response to the second control signal includes latching the first control signal at a leading edge of the second control signal, and the step of latching the first control signal in response to the third control signal includes latching the first control signal at a leading edge of the third control signal.

21. The method of claim 19, wherein the step of outputting the coarse lock detection signal includes outputting the coarse lock detection signal at a leading edge of the fifth control signal.

* * * * *